US012745490B2

(12) United States Patent
Chang et al.

(10) Patent No.: US 12,745,490 B2
(45) Date of Patent: Sep. 22, 2026

(54) MANUFACTURING METHOD OF LIGHT-EMITTING DEVICE WITH QUANTUM DOTS

(71) Applicant: QDLUX INC., Hsinchu City (TW)

(72) Inventors: Jung-Hua Chang, Hsinchu City (TW); Ching-Liang Yi, Hsinchu City (TW); Chen-Yang Huang, Hsinchu City (TW)

(73) Assignee: QDLUX, INC., Hsinchu City (TW)

( * ) Notice: Subject to any disclaimer, the term of this patent is extended or adjusted under 35 U.S.C. 154(b) by 375 days.

(21) Appl. No.: 18/367,300

(22) Filed: Sep. 12, 2023

(65) Prior Publication Data

US 2025/0031493 A1 Jan. 23, 2025

(30) Foreign Application Priority Data

Jul. 19, 2023 (CN) ......................... 202310887923.2

(51) Int. Cl.
*H10H 20/851* (2025.01)
*H10H 20/01* (2025.01)
*H10W 90/00* (2026.01)

(52) U.S. Cl.
CPC ........ *H10H 20/8512* (2025.01); *H10W 90/00* (2026.01); *H10H 20/0361* (2025.01)

(58) Field of Classification Search
CPC ........... H10H 20/8515; H10H 20/0361; H10H 20/01; H10H 20/8512; H10H 20/8514
See application file for complete search history.

(56) References Cited

U.S. PATENT DOCUMENTS

2012/0113672 A1* 5/2012 Dubrow ............... G02B 6/0055 977/774
2015/0368553 A1* 12/2015 Nelson .................... B32B 27/08 427/407.1
2017/0025585 A1* 1/2017 Fan .................... H10H 20/8514
2018/0198031 A1* 7/2018 Kim ................... H10H 20/8506
2021/0285624 A1* 9/2021 Wu ................... G02F 1/133606
2023/0197912 A1* 6/2023 Hwang ................ H10H 20/856 257/89

FOREIGN PATENT DOCUMENTS

EP 4071809 A1 * 10/2022 ........... H10W 90/00

* cited by examiner

*Primary Examiner* — Monica D Harrison
*Assistant Examiner* — Jacob T Nelson
(74) *Attorney, Agent, or Firm* — HDLS IPR SERVICES; Chun-Ming Shih

(57) ABSTRACT

An optical part includes a quantum dot film layer, a lower transparent film layer, and an outer protective film. The quantum dot film layer includes an upper surface, a lower surface, and a lateral surface. The lateral surface connects the upper surface with the lower surface, and the quantum dot film layer is a film containing light emitting semiconductor nanoparticles. The lower transparent film layer is disposed on the lower surface of the quantum dot film layer. The outer protective film directly or indirectly covers the upper surface of the quantum dot film layer, and extends to cover the lateral surface of the quantum dot film layer.

4 Claims, 7 Drawing Sheets

MANUFACTURING METHOD OF LIGHT-EMITTING DEVICE WITH QUANTUM DOTS

CROSS-REFERENCE TO RELATED APPLICATIONS

This non-provisional application claims priority claim under 35 U.S.C. § 119 (a) on China Patent Application No. 202310887923.2 filed Jul. 19, 2023, the entire contents of which are hereby incorporated by reference.

BACKGROUND

Technical Field

This disclosure relates to a light-emitting device equipped with a light-emitting diode, and in particular to an optical part, a light-emitting device with quantum dots, and a manufacturing method thereof.

Related Art

Quantum dots are excited by light to produce excitation spectra. Therefore, the quantum dots are often configured to convert a wavelength of a light-emitting diode, so that a light-emitting spectrum of a light-emitting device is not limited to the original light-emitting spectrum of the light-emitting diode, and the required illumination is obtained. Existing application of the quantum dots is to add semiconductor nanoparticles to a carrier base material, and directly cover a light-emitting diode chip with the carrier base material to form a quantum dot film layer to serve as an optical part of the light-emitting diode chip. Light emitted by the light-emitting diode chip passes through the quantum dot film layer so as to excite the quantum dots to produce excitation light.

The method for manufacturing the quantum dot film layer is usually to manufacture a large-area quantum dot film sheet in a manner of coating a base layer, and perform cutting to form the quantum dot film layer suitable for the size of the light-emitting diode chip. Additional transparent film layers are added above and below the quantum dot film sheet to protect the upper surface and the lower surface, thereby preventing the quantum point film from being directly exposed to the air and being in contact with oxygen and humidity. However, after the large-area quantum dot film layer is cut to form the quantum dot film layer suitable for the size of the light-emitting diode chip, the quantum dot film layer will be directly exposed and be still in contact with oxygen and humidity, so that the carrier base material is still easily degraded and deteriorated, thereby affecting the service life of the light-emitting diode light-emitting device.

SUMMARY

In view of the above problems, this disclosure provides an optical part, a light-emitting device with quantum dots, and a manufacturing method thereof, thereby prolonging the life of a quantum dot film layer.

This disclosure provides an optical part, including a quantum dot film layer, a lower transparent film layer, and an outer protective film. The quantum dot film layer includes an upper surface, a lower surface, and a lateral surface. The lateral surface connects the upper surface with the lower surface, and the quantum dot film layer is a film containing light emitting semiconductor nanoparticles. The lower transparent film layer is disposed on the lower surface of the quantum dot film layer. The outer protective film directly or indirectly covers the upper transparent film layer and extends to cover the lateral surface of the quantum dot film layer.

In one or more embodiments, the outer protective film is a coating of an inorganic material.

In one or more embodiments, a thickness of the outer protective film is between 10 nm and 500 nm; and a material of the outer protective film is selected from the group consisting of aluminum oxide, silicon dioxide or titanium dioxide.

In one or more embodiments, the optical part further includes an upper transparent film layer, disposed on the upper surface of the quantum dot film layer, and located between the upper surface and the outer protective film.

In one or more embodiments, a thickness of the lower transparent film layer and the upper transparent film layer is between 20 nm and 200 nm.

In one or more embodiments, the lower transparent film layer and the upper transparent film layer are made of an organic material, nano-scale inorganic powder mixed in the organic material or an inorganic material; and the nano-scale inorganic powder is selected from the group consisting of aluminum oxide, silicon dioxide or titanium dioxide.

This disclosure further provides a light-emitting device with quantum dots, including: a substrate, a light-emitting diode chip, and the optical part as described above. The light-emitting diode chip is disposed on the substrate. The optical part is fixed on the light-emitting diode chip in a manner that the lower transparent film layer faces the light-emitting diode chip.

In one or more embodiments, the outer protective film extends to a part, not covered by the optical part, of the substrate.

This disclosure further provides a manufacturing method of a light-emitting device with quantum dots, including: providing a base layer; disposing a quantum dot film layer above the base layer, wherein a lower transparent film layer is disposed on a lower surface of the quantum dot film layer; cutting the quantum dot film layer and the lower transparent film layer to form a plurality of optical part units; and forming an outer protective film to cover one lateral surface of each of the optical part units and directly or indirectly cover an upper surface of the quantum dot film layer to form a plurality of optical parts and transferring each of the optical parts to a plurality of light-emitting diode chips on one substrate.

In one or more embodiments, the step of forming the plurality of optical parts and transferring each of the optical parts to the plurality of light-emitting diode chips includes: forming the outer protective film to cover each of the optical part units; and stripping each of the optical parts from the base layer, and fixing each of the optical parts on the light-emitting diode chip on the substrate.

In one or more embodiments, the step of forming the plurality of optical parts and transferring each of the optical parts to the plurality of light-emitting diode chips includes: transferring the optical part units to the substrate, fixing each of the optical part units on the light-emitting diode chips, and stripping the base layer; and forming the outer protective film to cover each of the optical part units and extending to other parts of the substrate.

In one or more embodiments, an upper transparent film layer is disposed on the upper surface of the quantum dot film layer, and in each of the optical parts the upper transparent film layer is located between the upper surface and the outer protective film.

According to the light-emitting device and the manufacturing method thereof provided by this disclosure, the quantum dot film layer is completely covered with the outer protective film, and the quantum dot film layer does not have an exposed part, so that the outside air can be isolated through the outer protective film effectively. Therefore, the light-emitting device provided by this disclosure can effectively slow down the degradation of the material of the quantum dot film layer and prolong the life of the light-emitting device. Meanwhile, according to the manufacturing method provided by this disclosure, the light-emitting device can be produced in batches to maintain the required productivity.

BRIEF DESCRIPTION OF THE DRAWINGS

This disclosure will become more fully understood from the detailed description given herein below for illustration only, and thus not limitative of this disclosure, wherein.

DETAILED DESCRIPTION

Referring to FIG. 1 to FIG. 6, disclosed by the first embodiment of this disclosure are an optical part 100 with quantum dots, and a light-emitting device 200 with the optical part 100.

Figure 3:
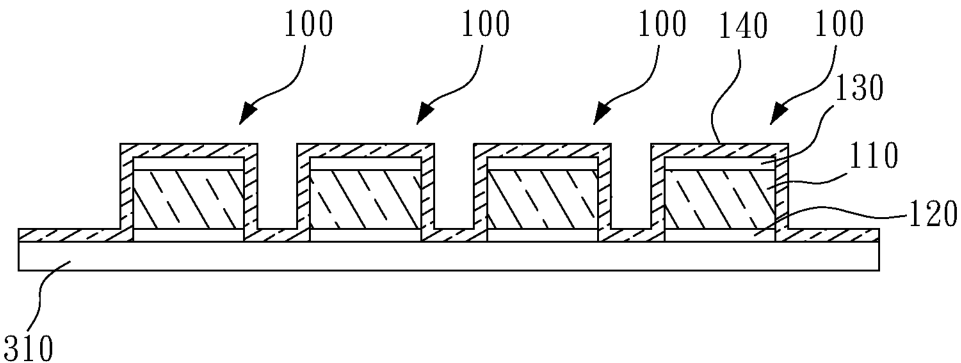
Figure 4:
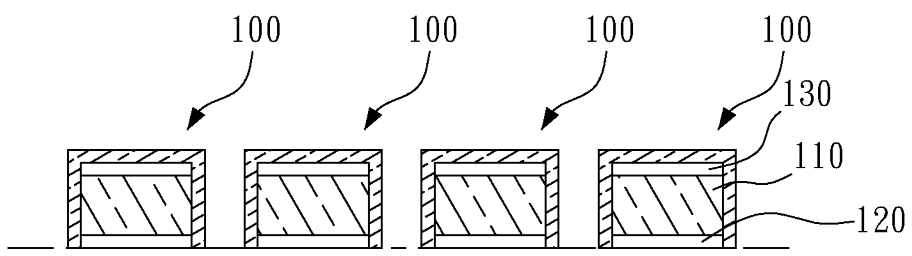

As shown in FIG. 3, the optical part 100 includes a quantum dot film layer 110, a lower transparent film layer 120, an upper transparent film layer 130, and an outer protective film 140.

As shown in FIG. 1 to FIG. 6, the quantum dot film layer 110 includes a lower surface 112, an upper surface 114, a lower surface 112, and a lateral surface 116 for connecting the upper surface 114 and the lower surface 112. The quantum dot film layer 110 is a film containing light emitting semiconductor nanoparticles. These particles may be excited by light emitted by a light-emitting diode chip 220 and converts a wavelength of the light emitted by the light-emitting diode chip 220, so that the light-emitting wavelength finally emitted by the light-emitting device 200 conforms to an expected spectrum, for example, the light finally emitted by the light-emitting device 200 may be converted to white light.

Figure 6:
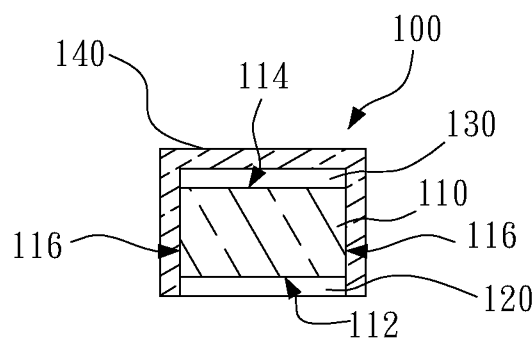
FIG. 6 is a cross-sectional view of an optical part according to the first embodiment of this disclosure.

As shown in FIG. 3 and FIG. 6, the lower transparent film layer 120 is disposed on the lower surface 112 of the quantum dot film layer 110. The outer protective film 140 directly or indirectly covers the upper surface 114, and further extends to cover the lateral surface 116 of the quantum dot film layer 110, so that the lower transparent film layer 120 and the lateral surface 116 of the quantum dot film layer 110 are covered by the outer protective film 140 and will not be exposed to the air.

Specifically, the upper transparent film layer 130 is disposed on the upper surface 114 of the quantum dot film layer 110 and located between the upper surface 114 and the outer protective film 140. In other words, the outer protective film 140 indirectly covers the upper surface 114 of the quantum dot film layer 110 and extends to cover the lateral surface 116 of the quantum dot film layer 110. The upper transparent film layer 130 is disposed on the upper surface 114 of the quantum dot film layer 110 and located between the upper surface 114 and the outer protective film 130.

The outer protective film 140 may be a coating of an inorganic material, which is manufactured through an atomic layer deposition (ALD) process, with a thickness between 10 nm and 500 nm. The material of the outer protective film 140 may be but not limited to aluminum oxide (Al2O3), silicon dioxide (SiO2) or titanium dioxide (TiO2), and has high rigidity and gas barrier property. Therefore, the material or setting manner of the outer protective film 140 is not limited, as long as the lateral surface 116 of the quantum dot film layer 110 can be isolated from the outside air.

Figure 7:
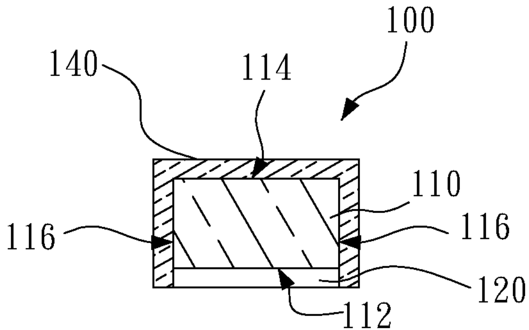
FIG. 7 is another cross-sectional view of an optical part according to the first embodiment of this disclosure.

As shown in FIG. 7, in addition, the upper side and the lateral surface 116 of the quantum dot film layer 110 are coated with the outer protective film 140 through a film-coating technology; therefore, in a specific embodiment, the upper transparent film layer 130 may be omitted, so that the outer protective film 140 directly covers the upper surface 114 of the quantum dot film layer 110.

Specifically, the material of the lower transparent film layer 120 and the upper transparent film layer 130 may be a pure organic material, for example, PE, and is an adhesive that can perform rapid coating through dispensing and spray coating, with a thickness between 20 μm and 200 μm.

In addition, the material of the lower transparent film layer 120 and the upper transparent film layer 130 may also be an adhesive that is formed by further mixing nano-scale inorganic powder, for example, Al2O3, SiO2 or Al2O3 into the organic material and can perform rapid coating through dispensing and spray coating. Or the lower transparent film layer 120 and the upper transparent film layer 130 may be an inorganic material formed on the lower surface 112 and the upper surface 114 through various manners such as film coating and deposition.

Figure 5:
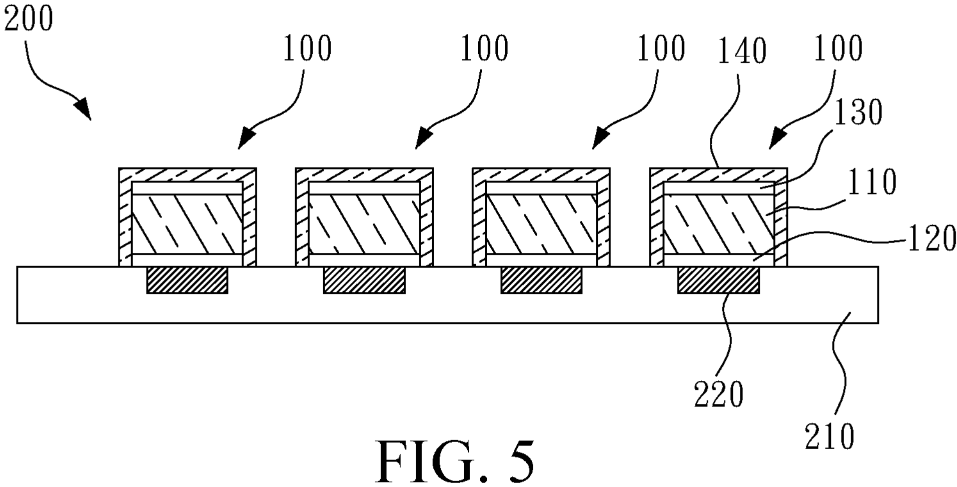
FIG. 5 is a cross-sectional view of a light-emitting device with quantum dots according to the first embodiment of this disclosure.

As shown in FIG. 5, based on the optical part 100 with quantum dots, the light-emitting device 200 includes a substrate 210, at least one light-emitting diode chip 220, and the optical part 100. The number of the light-emitting diode chips 220 and the number of the optical parts 100 are matched with each other. That is, each light-emitting diode chip 220 is matched with one optical part 100 for use.

As shown in FIG. 5, the light-emitting diode chip 220 may be but not limited to a blue light LED. The light-emitting diode chip 220 is disposed on the substrate 210; and the optical part 100 is fixed on the light-emitting diode chip 220 in a manner that the lower transparent film layer 120 faces the light-emitting diode chip 220. Therefore, the lower transparent film layer 120 covers the light-emitting diode chip 220, so that the lower transparent film layer 220 and the quantum dot film layer 110 are separated by the lower transparent film layer 120. Therefore, in a case that the light-emitting diode chip 220 is energized to emit light, high temperature generated by the light-emitting diode chip 220 will not directly affect the quantum dot film layer 110.

As shown in FIG. 5, in the meanwhile, the outer protective film 140 covers the upper transparent film layer 130 and further extends to cover the lateral surface 116 of the quantum dot film layer 110. That is, for the optical part 100 fixed on the light-emitting diode chip 220, the upper surface 114, the lower surface 112 and the lateral surface 116 of the quantum dot film layer 110 are completely covered by the upper transparent film layer 130, the lower transparent film layer 120 and the outer protective film 140. The quantum dot film layer 110 and the outside air can be effectively isolated, thereby preventing the quantum dot film layer 110 from degradation due to water or oxygen in the air. In addition, in FIG. 1, the outer protective film 140 only covers the upper transparent film layer 130 and the lateral surface 116 of the quantum dot film layer 110. Based on the difference of the film-coating process the outer protective film 140 may further extend to a part, not covered by the optical part 100, of the surface of the substrate 210.

In addition, as shown in FIG. 7, the upper transparent film layer 130 may also be omitted, so that the outer protective film 140 directly covers the upper surface 114.

Figure 1:
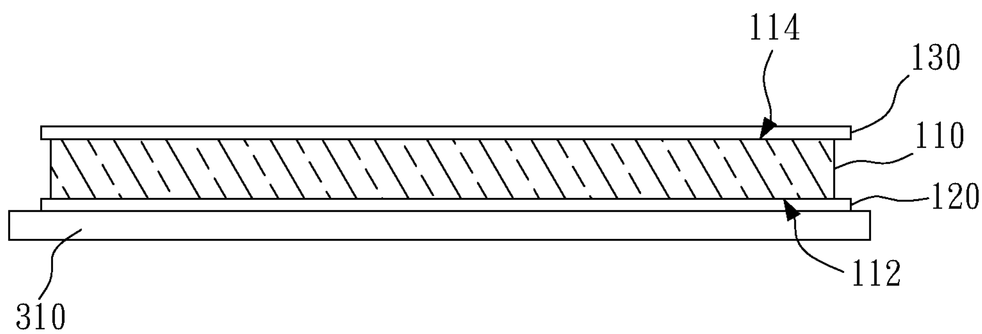
FIG. 1 to FIG. 4 are cross-sectional views of a semi-finished product of a light-emitting device with quantum dots according to a first embodiment of this disclosure.
Figure 8:
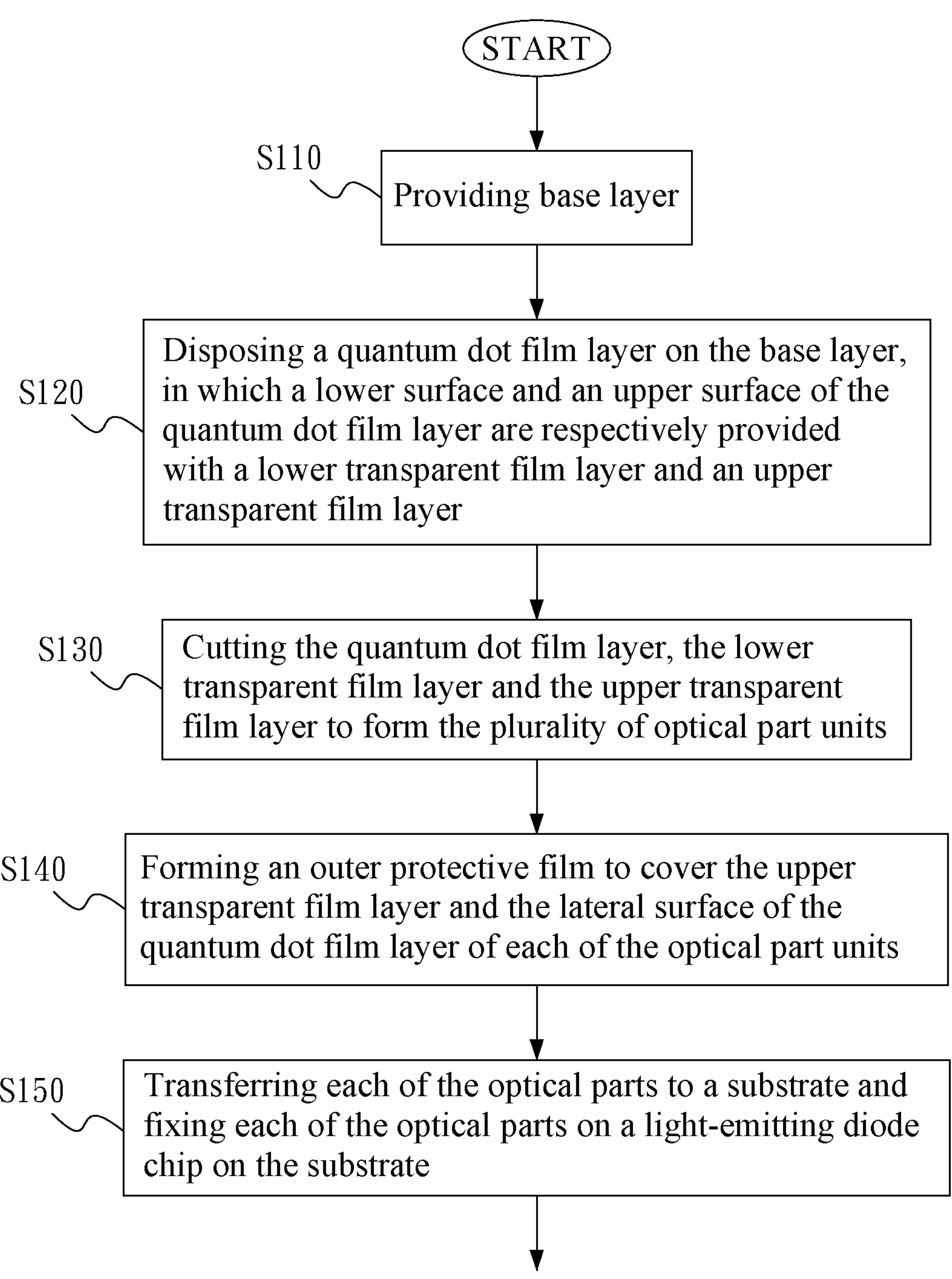
FIG. 8 is a flowchart of a manufacturing method of a light-emitting device with quantum dots according to the first embodiment of this disclosure.

As shown in FIG. 1 and FIG. 8, this disclosure provides a manufacturing method of a light-emitting device 200 with quantum dots. Firstly, a base layer 310 is provided, where the base layer 310 may be a carrier substrate, a transfer adhesive tape, or a release film, as shown in step S110.

Specifically, the base layer 310 is configured to temporarily or permanently dispose the optical part 100 thereon. For example, in a case that the base layer 310 is the transfer adhesive tape or the release film, the optical part 100 is temporarily disposed on the base layer 310, and the optical part 100 or optical part units manufactured subsequently may be stripped from the base layer 310 to transfer to a backlight module substrate 210 (for example, PCB or glass) or other circuit boards 210 for die bonding operation such as surface mounting and welding. In a case that the base layer 310 is a backlight module substrate 210 or a circuit board 210, the light-emitting diode chip 220 is permanently disposed on the base layer 310 through the die bonding operation such as surface mounting and welding; and the optical part 100 is directly manufactured on the base layer 310 and then fixed on the light-emitting diode chip 220.

As shown in FIG. 1 and FIG. 8, then, a quantum dot film layer 110 is disposed above the base layer 310, a lower surface 112 and an upper surface 114 of the quantum dot film layer 110 are respectively provided with a lower transparent film layer 120 and an upper transparent film layer 130, and the lower transparent film layer 120 is located on the base layer 310, as shown in step S120.

Specifically, a thickness of the quantum dot film layer 110 is between 20 μm and 200 μm; and the material of the quantum dot film layer may be an adhesive that can perform coating through dispensing and spray coating, such as photo-hardening adhesive mixed nanoparticles and can be widely coated on the base layer 310. The thickness of the lower transparent film layer 120 is between 20 μm and 200 μm; and the material of the lower transparent film layer may be an adhesive that can perform coating through dispensing and spray coating, such as photo-hardening adhesive, and the lower transparent film layer includes low thermal conduction coefficient. The lower transparent film layer 120 may form a high temperature difference between a surface of the light-emitting diode chip 220 and the quantum dot film layer 110, thereby preventing the lower surface 112 of the quantum dot film layer 110 from directly bearing the high temperature of the lower transparent film layer 220 and slowing down the degradation of the quantum dot film layer 110 due to heating. The upper transparent film layer 130 is disposed on the upper surface 114 with a thickness between 20 μm and 200 μm; the material of the upper transparent film layer may be an adhesive that can perform coating through dispensing and spray coating, such as photo-hardening adhesive; and the upper transparent film layer 130 provides additional protection for the quantum dot film layer 110 and adjusts the optical characteristic. In addition, a material of each of the lower transparent film layer 120 and the upper transparent film layer 130 may also be an adhesive that is formed by further mixing nano-scale inorganic powder, for example, Al2O3, SiO2 or Al2O3 into the organic material and can perform rapid coating through dispensing and spray coating. Or the lower transparent film layer 120 and the upper transparent film layer 130 may be an inorganic material, and is formed on the lower surface 112 and the upper surface 114 through various manners such as film coating and deposition.

Figure 2:
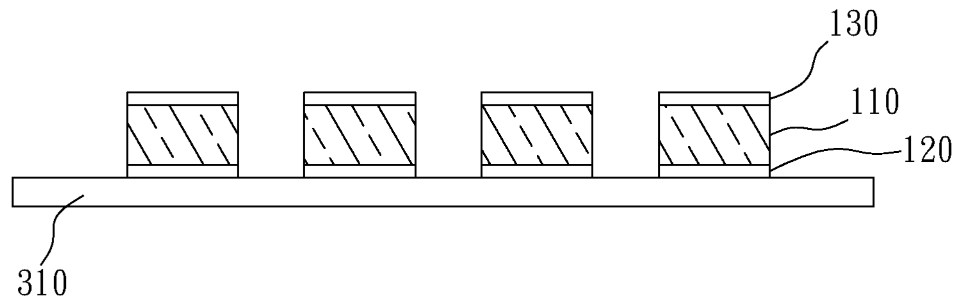

As shown in FIG. 2 and FIG. 8, then, the quantum dot film layer 110, the lower transparent film layer 120 and the upper transparent film layer 130 are cut to form the plurality of optical part units, as shown in step S130. The above cutting may be laser cutting, or water jet cutting.

As shown in FIG. 3 and FIG. 8, each of the optical part units is subjected to film coating to form an outer protective film 140 to cover the upper transparent film layer 130 and the lateral surface 116 of the quantum dot film layer 110 of each of the optical part units to form a plurality of optical parts 100, as shown in step S140. In addition, as shown in FIG. 7, the upper transparent film layer 130 may also be omitted, so that the outer protective film 140 directly covers the upper surface 114.

Each of the optical parts 100 is stripped from the base layer 310, transferred to a substrate 210 and fixed on the light-emitting diode chip 220 on the substrate 210, as shown in step S150. The plurality of optical parts 100 may be disposed on the corresponding light-emitting diode chip 220 through a pick and place process (P&P).

Referring to FIG. 1, FIG. 2, and FIG. 9 to FIG. 12, disclosed by the second embodiment of this disclosure are an optical part 100 with quantum dots, and a light-emitting device 200 with the optical part 100. The optical part 100 includes a quantum dot film layer 110, a lower transparent film layer 120, an upper transparent film layer 130, and an outer protective film 140.

Figure 11:
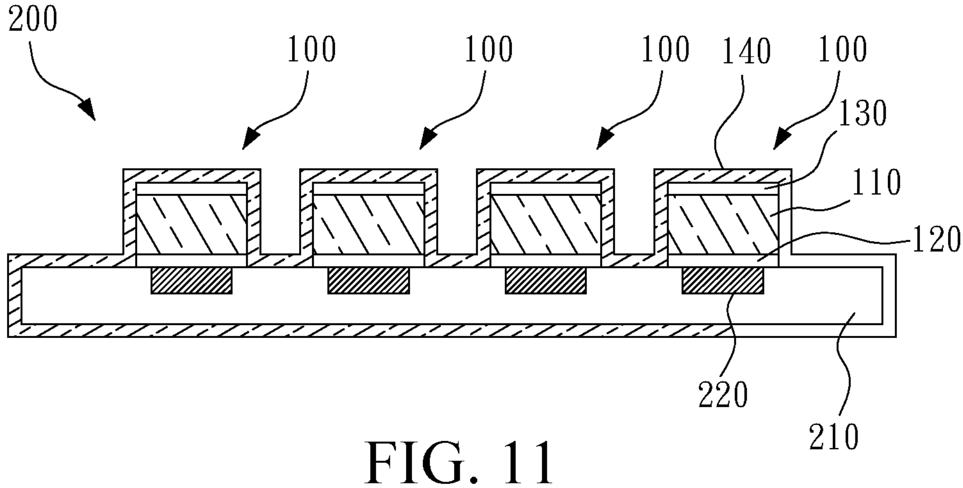
FIG. 11 is a cross-sectional view of an optical part according to the second embodiment of this disclosure.

In the second embodiment, the structure of the light-emitting device 200 or the optical part 100 is basically the same as that of the first embodiment, but the difference is that the coverage range of the outer protective film 140 is different. In the second embodiment, after the optical part units are fixed on the light-emitting diode chip 220 on the substrate 210, the whole substrate 210 and the optical part units are subjected to an ALD film-coating process. Therefore, as shown in FIG. 11, the outer protective film 140 further coats other parts of the whole substrate 210 in addition to covering the upper transparent film layer 130 and the lateral surface 116 of the quantum dot film layer 110, so that a surface of the substrate 210 between the optical parts 100, a side edge of the substrate 210 and a bottom surface of the substrate 210 are covered by the outer protective film 140. The outer protective film 140 coats the light-emitting device 200 more perfectly, thereby further prolonging the service life of the light-emitting device 200.

The manufacturing method of the light-emitting device 200 with quantum dots in the second embodiment varies based on the distribution change of the outer protective film 140.

Figure 12:
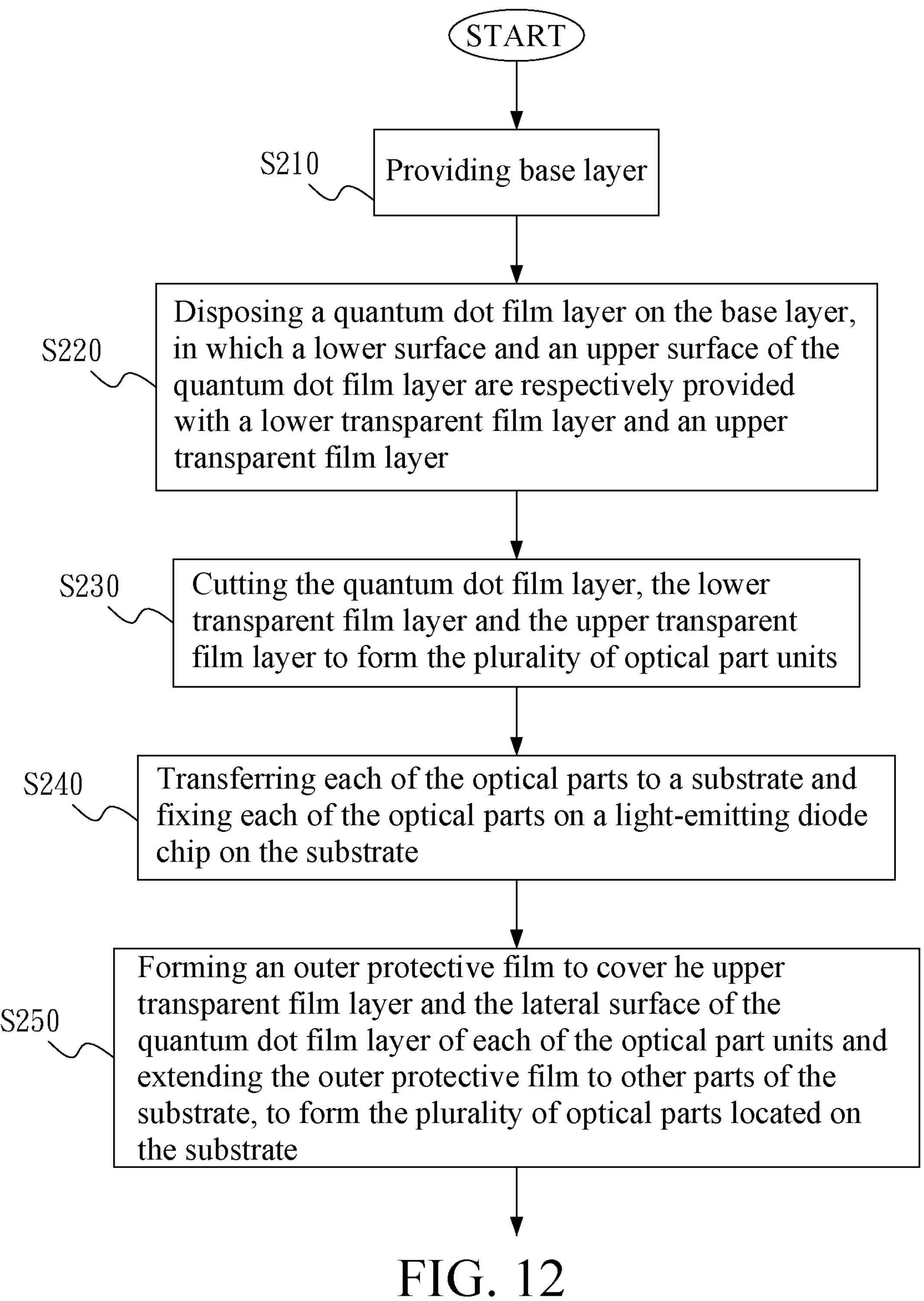
FIG. 12 is a flowchart of a manufacturing method of a light-emitting device with quantum dots according to the first embodiment of this disclosure.

As shown in FIG. 1 and FIG. 12, firstly, a base layer 310 is provided, where the base layer 310 may be a carrier substrate, a transfer adhesive tape, or a release film, as shown in step S210.

As shown in FIG. 1 and FIG. 12, then, a quantum dot film layer 110 is disposed above the base layer 310, a lower surface 112 and an upper surface 114 of the quantum dot film layer 110 are respectively provided with a lower transparent film layer 120 and an upper transparent film layer 130, as shown in step S220.

Different from the first embodiment, the upper transparent film layer 130 is located on the base layer 310, that is, the lower surface 112 of the quantum dot film layer 110 and the lower transparent film layer 120 are located on one side away from the base layer 310.

Figure 9:
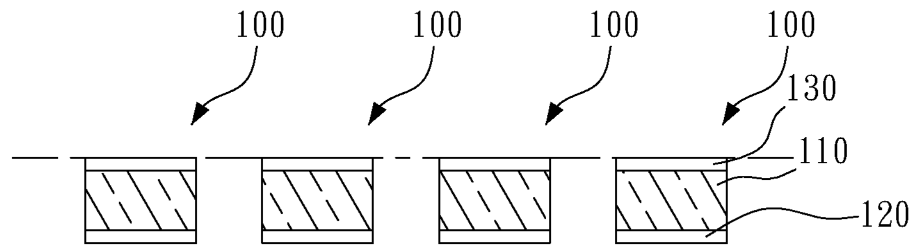
FIG. 9 to FIG. 10 are cross-sectional views of a semi-finished product of a light-emitting device with quantum dots according to a second embodiment of this disclosure.

As shown in FIG. 9 and FIG. 12, then, the quantum dot film layer 110, the lower transparent film layer 120 and the upper transparent film layer 130 are cut to form the plurality of optical part units, as shown in step S230.

Figure 10:
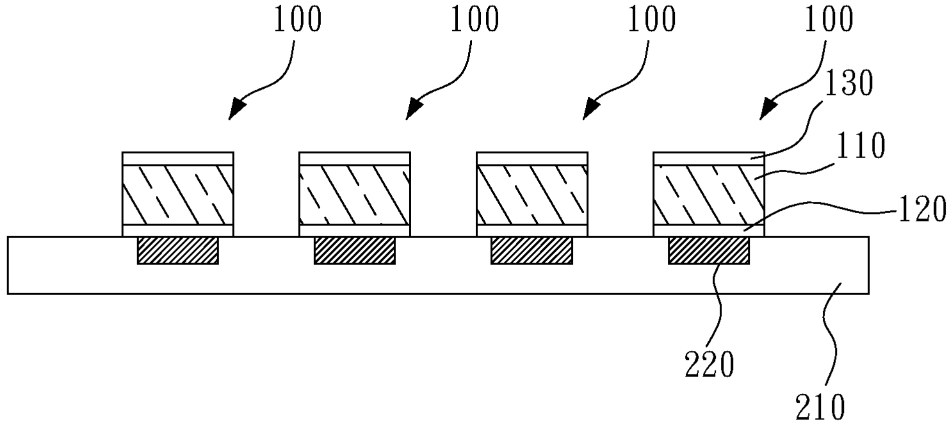

As shown in FIG. 10 and FIG. 12, the base layer 310 is directly turned over, the optical part units are transferred by moving the base layer 310 to a substrate 210, each of the optical part unit is fixed on the light-emitting diode chip 220 on the substrate 210, and the base layer 310 is stripped, as shown in step S240.

As shown in FIG. 11 and FIG. 12, each of the optical part units and the substrate 210 are subjected to film coating to form an outer protective film 140 to cover the upper transparent film layer 130 and the lateral surface 116 of the quantum dot film layer 110 of each of the optical part units and extend to other parts of the substrate 210 to form the plurality of optical parts 100 located on the substrate 210, as shown in step S250.

According to the light-emitting device 200 and the manufacturing method thereof provided by this disclosure, the quantum dot film layer 110 is completely coated with the outer protective film 140, and the quantum dot film layer 110 does not have an exposed part, so that the outside air can be isolated through the outer protective film 140 effectively. Therefore, the light-emitting device 200 provided by this disclosure can effectively slow down the degradation of the material of the quantum dot film layer 110 and prolong the life of the light-emitting device 200. Meanwhile, according to the manufacturing method provided by this disclosure, the light-emitting device 200 can be produced in batches to maintain the required productivity.

What is claimed is:

1. A manufacturing method of a light-emitting device with quantum dots, comprising:
- providing a base layer;
- disposing a quantum dot film layer above the base layer, wherein a lower transparent film layer is disposed on a lower surface of the quantum dot film layer;
- cutting the quantum dot film layer and the lower transparent film layer to form a plurality of optical part units; and
- forming an outer protective film to cover one lateral surface of each of the optical part units and directly or indirectly completely cover an upper surface of the quantum dot film layer to form a plurality of optical parts and transferring each of the optical parts to a plurality of light-emitting diode chips on one substrate.

2. The manufacturing method as claimed in claim 1, wherein the step of forming the plurality of optical parts and transferring each of the optical parts to the plurality of light-emitting diode chips comprises:
- forming the outer protective film to cover each of the optical part units; and
- stripping each of the optical parts from the base layer, and fixing each of the optical parts on the light-emitting diode chip on the substrate.

3. The manufacturing method as claimed in claim 1, wherein the step of forming the plurality of optical parts and transferring each of the optical parts to the plurality of light-emitting diode chips comprises:
- transferring the optical part units to the substrate, fixing the optical part units on the light-emitting diode chips, and stripping the base layer; and
- forming the outer protective film to cover each of the optical part units and extending to other parts of the substrate.

4. The manufacturing method as claimed in claim 1, wherein an upper transparent film layer is disposed on an upper surface of the quantum dot film layer, and in each of the optical parts the upper transparent film layer is located between the upper surface and the outer protective film.

* * * * *